(12) United States Patent
Ibok

(10) Patent No.: US 6,228,746 B1
(45) Date of Patent: *May 8, 2001

(54) METHODOLOGY FOR ACHIEVING DUAL FIELD OXIDE THICKNESSES

(75) Inventor: Effiong E. Ibok, Sunnyvale, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,149

(22) Filed: Dec. 18, 1997

(51) Int. Cl.[7] .................................................. H01L 21/762
(52) U.S. Cl. ............................................ 438/425; 438/444
(58) Field of Search ................................... 438/405, 425, 438/426, 427, 295, 296, 297, 452, 424, 430, 439, 431, 444, 756

(56) References Cited

U.S. PATENT DOCUMENTS

| | | | |
|---|---|---|---|
| 3,871,931 | * 3/1975 | Godber | 438/756 |
| 4,269,654 | * 5/1981 | Deckert et al. | 438/756 |
| 4,574,465 | * 3/1986 | Rao | 438/250 |
| 4,842,675 | * 6/1989 | Chapman et al. | 438/425 |
| 5,316,965 | 5/1994 | Philipossian et al. | |
| 5,646,063 | * 7/1997 | Mehta et al. | 438/425 |
| 5,731,221 | * 3/1998 | Kwon | 437/67 |
| 5,786,262 | * 7/1998 | Jang et al. | 438/424 |
| 5,915,191 | * 6/1999 | Jun | 438/431 |

OTHER PUBLICATIONS

Wolf "Silicon Processing for the VLSI Era" vol. 3, Lattice Press, 1995, pp. 367–373.*
Wolf et al. "Silicon Processing for the VLSI Era" Lattice Press, vol. 1, p. 191–195 and 532–534, 1986.*

* cited by examiner

Primary Examiner—Olik Chaudhuri
Assistant Examiner—Anh Duy Mai

(57) ABSTRACT

Methodology for achieving dual field oxide thicknesses comprises forming field oxide isolation regions to a common thickness. An oxidation barrier layer, which may comprise nitride or oxynitride, is formed on selected field oxide regions leaving others exposed. The exposed field oxide regions are enlarged in a complementary thermal oxidation step, wherein the isolation regions covered by the oxidation barrier layer are not enlarged, thereby achieving field oxide regions of at least two thicknesses.

33 Claims, 3 Drawing Sheets

METHODOLOGY FOR ACHIEVING DUAL FIELD OXIDE THICKNESSES

TECHNICAL FIELD

The present invention relates to manufacturing semiconductor devices having a plurality of operating voltages and, more particularly, to manufacturing very large scale integration and high density semiconductor devices with submicron design features and active regions isolated by isolation structures.

BACKGROUND ART

Escalating demands for high density and performance associated with ultra large scale integration require semiconductor devices with design features of 0.25 microns and under, e.g. 0.18 microns, increased transistor and circuit speeds, high reliability, and increased manufacturing throughput. The reduction of design features to 0.25 microns and under challenges the limitations of conventional semiconductor technology for isolating active regions.

Conventional semiconductor devices comprise a substrate having various electrically isolated regions, called active regions, in which individual circuit components are formed. The active region typically includes source/drain regions of a transistor formed in the semiconductor substrate or epitaxial layer, spaced apart by a channel region. A gate electrode for switching the transistor is formed on the channel with a gate oxide layer therebetween. The quality and thickness of the gate oxide are crucial for the performance and reliability of the finished device.

The electrical isolation of these active regions is typically accomplished by defining field regions bounding the active regions, defined by a source/drain mask applied to a barrier nitride layer deposited over the semiconductor substrate, typically doped monocrystalline silicon or an epitaxial layer formed thereon. Thermal oxidation of semiconductor substrate in the exposed field regions is typically employed to form the field oxide isolation structure that isolates the active regions.

For example, one type of isolation is known as Local Oxidation Of Silicon (LOCOS), in which the entirety of the field oxide is formed by heating the substrate with the field regions exposed to an oxidizing gas, such as oxygen or water vapor. LOCOS methodology, however, disadvantageously results in the formation of a field oxide region having tapering edges, because the oxidizing species for forming the field oxide diffuses horizontally once it has penetrated the substrate. This tapering end portion resembles and, therefore, is commonly referred to as, a "bird's beak."

LOCOS methodology is thus subject to several inherent problems. For example, while the horizontal extent of the bird's beak can be loosely controlled by the stress induced in the masking layers adjacent to the field, this same stress can cause strain defects in the active areas including point defects, dislocations, stacking faults, as well as catastrophic failures such as delamination, particle generation, etc. Moreover, the aggressive scaling of gate electrode dimension into the deep submicron regime, such as less than about 0.25 microns, requires tighter source/drain region to source/drain region spacing, which is adversely affected by the bird's beak attendant upon LOCOS methodology.

Another type of isolation is known as shallow trench isolation (STI). This form of isolation is typically accomplished by etching a trench in the substrate, conducting a thermal oxidation step to grow an oxide liner on the trench walls to control the silicon-silicon dioxide interface quality, and filling the lined trench with an insulating material, such as silicon dioxide derived from tetraethyl orthosilicate (TEOS). The surface is then planarized, as by chemical-mechanical polishing (CMP), to complete the trench isolation structure. A typical trench isolation structure thus comprises an internal surface with side surfaces extending into the substrate (or epitaxial layer) with edges at the main surface of the substrate and at the bottom of the trench.

Certain semiconductor devices have circuit components operating at different voltages. For example, a FLASH memory device comprises core circuitry that stores the memory bits and peripheral circuitry for decoding row and column addresses. For enhanced operating speed, it is desirable to operate the core circuitry at a fairly low voltage, such as about 1.8 V to about 2 V. The peripheral circuitry, however, is typically operated at a higher voltage, such as 5 V, for reliability concerns. As another example, certain speed-critical components of a microprocessor are typically operated at a lower voltage, but less speed-critical components of the microprocessor are operated at a higher voltage.

The isolation of circuit components is affected by the operating voltage of the circuit components. In particular, a higher operating voltage necessitates a thicker field oxide region to achieve a desired amount of isolation. For example, a field oxide region grown by LOCOS to a depth of about 2000 Å to about 2500 Å the main surface of the substrate can isolate circuitry running at about 1.8 V to about 2 V. However, circuitry operating at about 5 V requires a field oxide region grown by LOCOS to about 4000 Å in depth, which is almost twice as thick. For shallow trench isolation, the required depths for circuit components operating at about 2 V and 5 V are respectively about 2000 Å and about 3500 Å.

In general, deep field isolation structures are undesirable. For example, deeper isolation trenches tend to have side walls that are more vertically aligned and induce stress, which is transmitted to the adjacent active regions and degrades the gate oxide grown thereon. As another example, deeper LOCOS field oxide structures tend to exhibit a more extensive bird's beak, limiting the useful area of the adjacent active region.

Due to these disadvantages associated with deep isolation structures, it is generally desirable to avoid manufacturing isolation structures deeper than necessary. However, a common depth for the field oxide isolation structures must be deep enough to isolate the circuit components operating at the highest voltage but deeper than necessary for those circuit components operating at a lower voltage. Thus, semiconductor devices that have circuit components operating at different voltages and, hence, requiring different minimum depths of field oxide for isolation, are typically manufactured with field oxide isolation structures at the different depths sufficient to achieve isolation of active regions.

A conventional approach to manufacturing isolation structures of different depths comprises separately forming each set of isolation structures. For example, in a FLASH memory, the isolation for the core is created first by depositing a thick nitride layer, patterning the thick nitride layer to define the core field oxide regions, as by masking and etching, and then creating the core isolation structures, as by LOCOS or trench etch and fill. The patterned thick nitride layer is then stripped off, and a second thick nitride layer is deposited for the peripheral isolation structures. This second nitride layer is then patterned, as by masking etching, to define the peripheral field oxide regions. Thereupon, the peripheral isolation structures are created to a greater depth than the core isolation structures. It is evident that this conventional approach is complex, costly, and time-consuming, requiring many manufacturing steps, for example, two thick nitride deposition steps or two trench etch steps.

DISCLOSURE OF THE INVENTION

There exists a need for reducing the cost and complexity of manufacturing a semiconductor device with isolation structures of at least two different thicknesses. There is also a need for reducing the number of thick nitride deposition steps and trench etch steps.

These and other needs are met by the present invention, in which a portion of deeper field oxide isolation structures are formed concurrently with shallower field oxide isolation structures. Then, the field oxide isolation structures requiring greater depth are selectively enlarged, e.g. as defined by a patterned, barrier oxidation layer such as a deposited nitride or oxynitride layer.

Additional needs, objects, advantages, and other features of the present invention will be set forth in part in the description which follows and in part will become apparent to those having ordinary skill in the art upon examination of the following or may be learned from the practice of the invention. The needs, objects, and advantages of the present invention may be realized and obtained as particularly pointed out in the appended claims.

Accordingly, one aspect of the present invention is a method of manufacturing a semiconductor device having a first active region isolated by a first isolation structure and a second active region isolated by a second isolation structure. The method comprises concurrently forming the first isolation structure and the second isolation structure to a common first thickness; and selectively enlarging the second isolation structure to a second thickness.

Another aspect of the present invention is a method of manufacturing a semiconductor device having an active region isolated by a first insulated trench. The method comprises: forming a first trench opening in a semiconductor substrate or in an epitaxial layer formed thereon; filling the first trench opening with an insulating material; and enlarging the first insulated trench by thermal oxidation after said filling.

Additional needs, objects, and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention simplifies manufacturing semiconductor devices requiring isolation structures of different depths. Specifically, the present advantageously enables a reduction in the number of thick nitride layer deposition steps and, for shallow trench isolation, the number of trench etch steps. Such simplifications result in reduced manufacturing costs and improved production throughput.

In accordance with embodiments of the present invention, deep and shallow isolation structures are advantageously formed substantially concurrently, as by LOCOS or STI, to the depth of the shallower isolation structure. For example, in a FLASH memory device, the isolation structures for the core and periphery may be first formed to a depth of about 2000 Å to about 2500 Å.

Subsequently, the isolation structures that require a greater depth are selectively enlarged by a complementary, thermal oxidation step. Embodiments of the present invention include depositing and patterning an oxidation barrier layer, as by masking and etching, to cover the field regions for the core circuitry. The oxidation barrier layer comprises a material that prevents or greatly retards the diffusion of oxidizing species therethrough (i.e. molecular oxygen or water vapor), so that the subsequent thermal oxidation step does not grow the core isolation structures. Suitable oxidation barrier materials includes silicon nitride and silicon oxynitride. The oxidation barrier layer is preferably deposited by plasma-enhanced chemical vapor deposition (PECVD) to a depth of about 100 Å to facilitate removal thereof by an aqueous hydrofluoric acid dip.

Figure 1A:
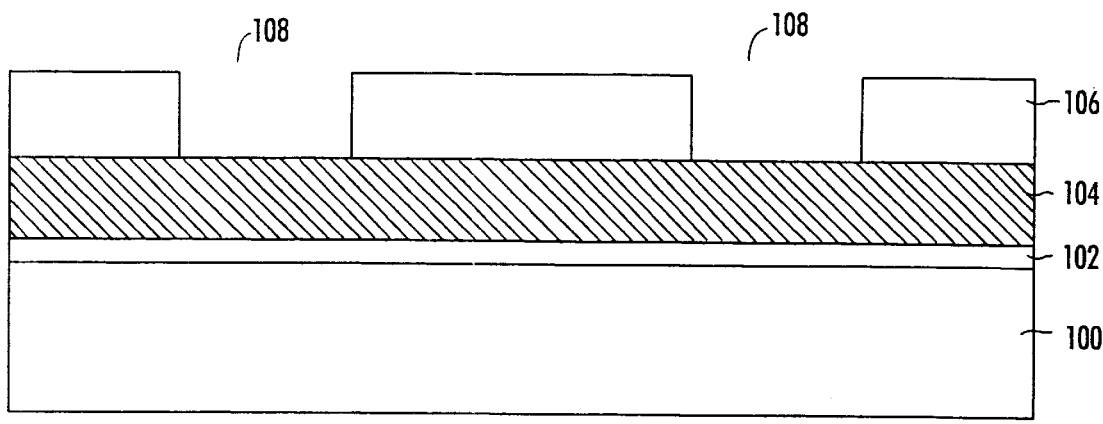
FIGS. 1A through 1H schematically illustrate sequential phases of manufacturing isolation structures to respective thicknesses according to an embodiment of the present invention.

An embodiment of the present invention is schematically illustrated in FIGS. 1A through 1I, wherein similar elements bear similar reference materials. Referring to FIG. 1A, a substrate 100 is prepared, typically a semiconductor substrate comprising doped monocrystalline silicon or an epitaxial layer formed on a silicon substrate in accordance with conventional practices. A pad oxide layer 102 is then formed on substrate 100. Pad oxide layer 102 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer.

Subsequently, a nitride layer 104 is deposited on silicon oxide pad layer 102, such as a silicon nitride layer by CVD. Silicon oxide pad layer 102 functions as a buffer layer cushioning stresses between substrate 100 and silicon nitride layer 104. Silicon nitride layer 104 functions as an oxidation mask because it is resistant to the diffusion of oxygen and water vapor therethrough, thereby preventing an oxidizing species from reaching the underlying silicon substrate. A photoresist mask 106 is formed upon the deposited silicon nitride layer 104 having a pattern defined, e.g., by openings 108 with a width, such as less than about 0.375 micron, e.g., less than about 0.25 micron.

Figure 1B:
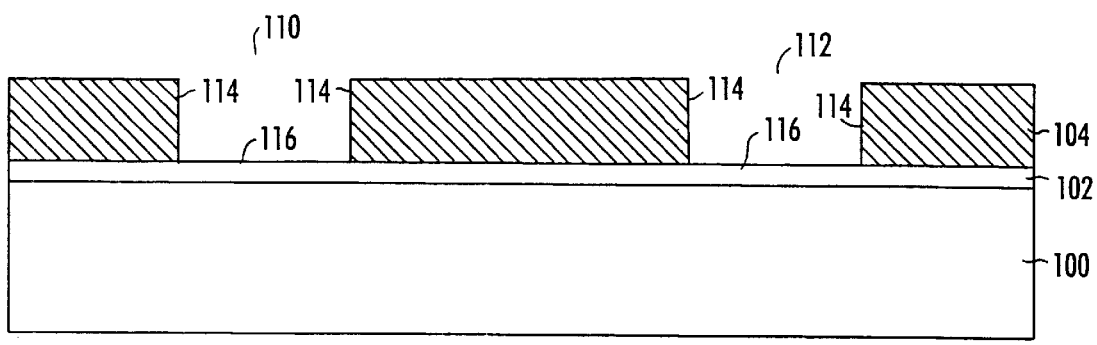

Referring to FIG. 1B, the barrier nitride is etched to form openings 110 and 112 with widths substantially corresponding to the widths of openings 108 in photoresist mask 106. An opening, e.g. opening 110, has an internal surface defined, in part, by side surfaces 114 and top surface 114 of the pad oxide layer 116. Photoresist 106 is then stripped. According to an embodiment, as illustrated in FIG. 1B, etching of openings 110 and 112 in the barrier nitride layer 104 stops at or slightly within pad oxide layer 102, leaving portions 116 of pad oxide layer 102 remaining on substrate 100 within openings 110 and 112. Alternatively, etching to pattern the barrier nitride layer 104 can be continued, removing all of pad oxide layer 102 located within openings 110 until substrate 100 is reached. In yet another implementation, pad oxide layer 102 is partially etched, followed by a dip in an aqueous hydrofluoric acid (HF) solution, e.g. 10 (water):1(HF), to remove any remaining pad oxide in the opening 110.

Figure 1C:
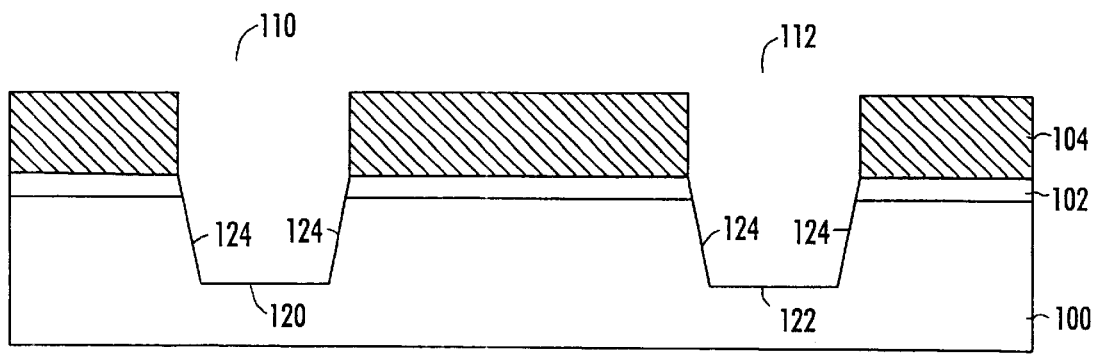

Referring to FIG. 1C, an anisotropic trench etch is performed to remove portions of substrate 100 beneath the openings 110 and 112 to create trenches 120 and 122, respectively. Each of trenches 120 and 122 has an internal surface defined, in part, by side surfaces 124 which are vertically sloped, e.g. at an angle of about 70° to about 75°. Trench 110 can be etched to a suitable depth, e.g., about 2000 Å, to isolate circuit operation at a voltage of about 1.8 V to about 2 V. In an embodiment of the present invention, a high-power, low-pressure helium-chlorine (He—$Cl_2$) plasma chemistry is employed to etch the trenches 120 and 122 within the substrate 100. In alternative embodiments, other chemistries, such as a helium bromide (HBr) chemistry, may be employed. The appropriate parameters for anisotropic etching can be readily determined in a particular situation. For example the following conditions were found suitable: a power of about 600 watts to about 800 watts; a fixed $Cl_2$ flow rate of 60 sccm or less; a fixed He flow rate of 100 sccm or less; and a pressure of 0.2 Torr or less.

Figure 1D:
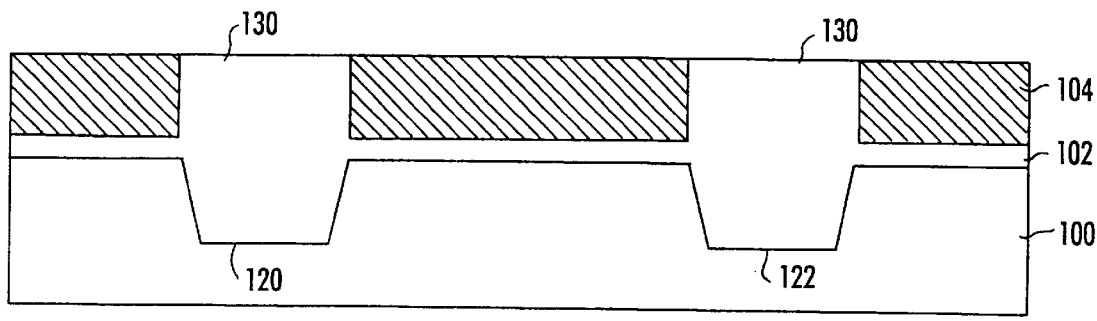

Subsequent to etching trenches 120 and 122, an oxide liner (not shown) is formed by thermal oxidation, during which the trench edges are consumed and, hence, rounded. The oxide liner formed on the trench edges is also rounded and has a thickness substantially the same as the thickness of the oxide liner at other portions in the trench, e.g., about 500 Å. Trenches 120 and 122 are filled with a suitable insulation material 130, as illustrated in FIG. 1D, e.g., silicon dioxide derived from TEOS by LPCVD or derived from silane by LPCVD. Alternatively, the trench can be filled with a high density plasma (HDP) oxide, employing the methodology disclosed in the commonly-assigned, copending application Ser. No. 08/924,133, filed on Sep. 5, 1997, now U.S. Pat. No. 6,046,106. Subsequent to trench filling, planarization is effected resulting in a substantially flat surface.

Figure 1E:
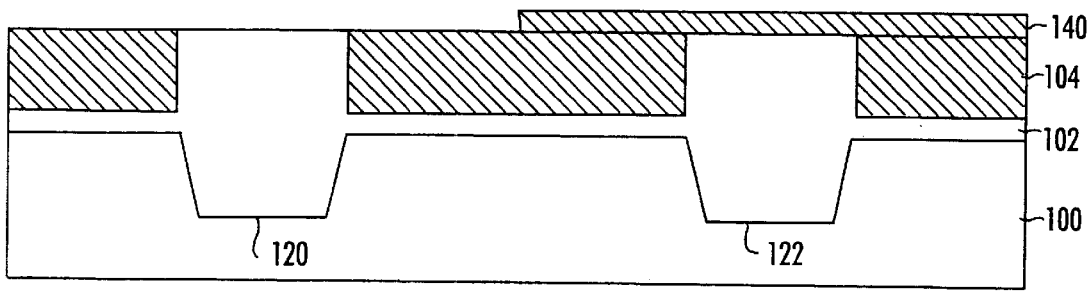

Referring to FIG. 1E, a layer of nitride or oxynitride is deposited and patterned, as by masking and etching, to create an oxidation barrier layer 140. The oxidation barrier layer 140 is preferably deposited to a thickness of about 100 Å. In an embodiment of the present invention, a nitride oxidation barrier layer 140 is deposited by PECVD at a power of about 250 W to about 350 W, a temperature of about 400° C. or less, and a pressure of 1 Torr or less, while feeding silane ($SiH_4$) at a rate of about 50 sccm or less and ammonia ($NH_3$) at a rate of about 100 sccm or less. According to another embodiment, an oxynitride barrier layer 140 is deposited by feeding nitrous oxide ($N_2O$) at a rate of about 50 sccm or less.

After deposition of the oxidation barrier layer 140, a photoresist mask (not shown) is disposed thereon, which photoresist mask has openings over field oxide regions, e.g. the periphery, to be enlarged to a second thickness. The masked oxidation barrier layer 140 is etched, as by dry etching or wet etching, to expose the selected field oxide regions, e.g. isolation structure 120. In an embodiment of the present invention, the masked oxidation barrier layer is wet etched by a dip in a 10:1 aqueous HF solution, e.g., about 10(water):1(HF).

Figure 1F:
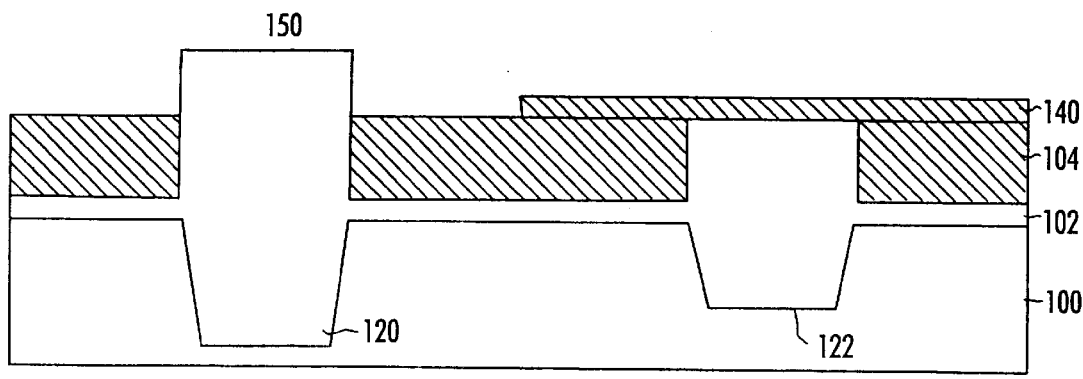

After depositing, masking (e.g. with a photoresist mask), and etching the oxidation barrier layer 140, one isolation structure 120 is exposed while the other isolation structure 122 is covered by the oxidation barrier layer 140. Referring to FIG. 1F, thermal oxidation is performed to relatively enlarge the exposed isolation structure 120, i.e., creating a thicker isolation structure 150. Enlargement of the covered isolation structure 122, on the other hand, is prevented by oxidation barrier layer 140. Consequently, two different isolation structures are formed, e.g. a deeper isolation structure 150 and a shallower isolation structure 122, employing only a single trench etching step and only a thick deposition of barrier nitride layer 104.

Thermal oxidation is preferably performed at temperature at about 950° C. or less, for example, at 900° C. to 950° C., using either water vapor (wet) or molecular oxygen (dry) as the oxidizing species for a period of time necessary to grow the exposed isolation structure 120 to the desired thickness. In forming a FLASH memory, wherein the peripheral isolation trenches are about 3500 Å to 4000 Å deep, a wet thermal oxidation step can require from about two to about three hours.

Figure 1G:
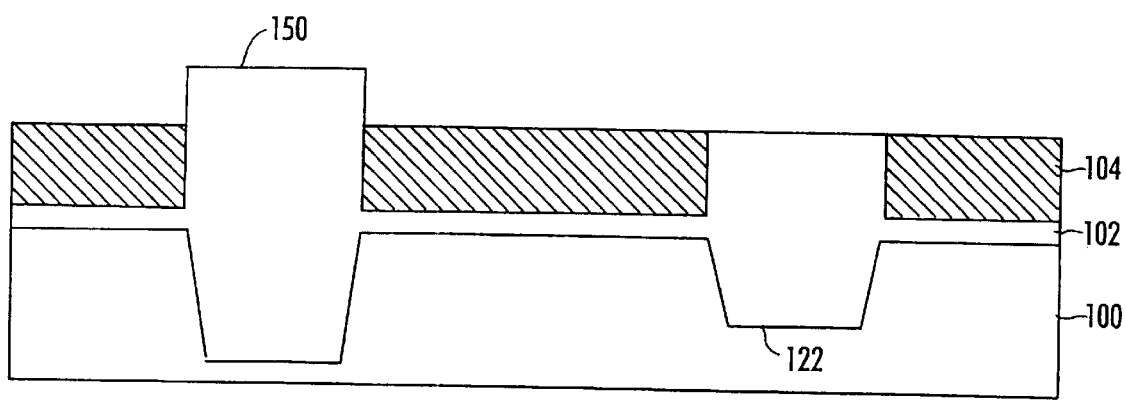

Referring to FIG. 1G, the remaining oxidation barrier layer 140 is removed by etching, preferably employing a aqueous HF solution dip of about 10(water):1(HF). In such a solution, nitride is etched at a rate of about six times faster than that of thermal oxide (for isolation structures grown by LOCOS) and four times faster than that of densified trench fill oxide. Thus, only about 25 Å to about 30 Å of the fill oxide is expected to be lost during this process.

Figure 1H:
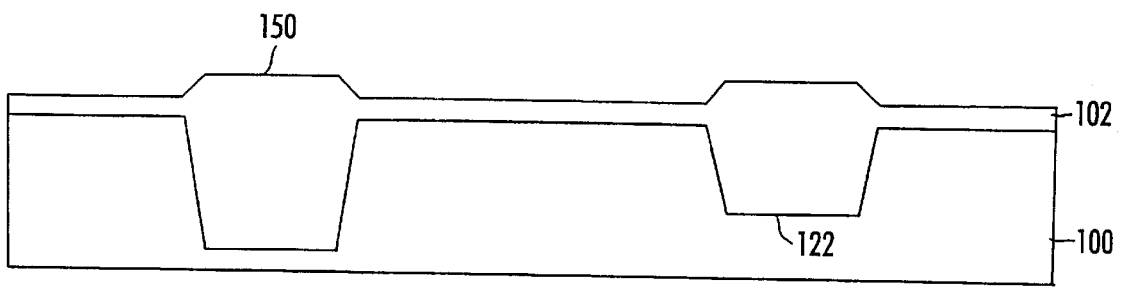

After some of the field oxide isolation structures have been selectively enlarged, the isolation structures are planarized, as by CMP, and the barrier nitride layer 104 is stripped off, as illustrated in FIG. 1H. At this point, there exist a shallower isolation structure 122, which had been covered by the oxidation barrier layer 140 during the complementary thermal oxidation, and a deeper isolation structure 150, which had been exposed during the complementary thermal oxidation. Thus, a dual field oxide thickness is achieved without two trench etch steps and without two depositions of a barrier nitride layer 104.

It is evident that the disclosed methodology is also effective in forming field oxide isolation structures created by LOCOS technology. Instead of the trench etch, fill, and planarization steps illustrated in FIGS. 1C and 1D, the field oxide isolation structures can be formed by LOCOS to a common thickness. According to an embodiment of the present invention, such field oxide isolation structures are grown by wet oxidation at a temperature of about 950° C. for about three hours.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices having a design rule less than about 0.25 micron, including less than about 0.18 micron.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having a first active region isolated by a first trench isolation structure and a second active region isolated by a second trench isolation structure, said method comprising:

concurrently forming the first trench isolation structure and the second trench isolation structure to a common first thickness by: (1) etching a first trench and a second trench to about the same depth; and (2) filling the first trench and the second trench with an insulating material; and selectively enlarging the second trench isolation structure to a second thickness and be deeper by thermal oxidation.

2. The method of claim 1, wherein:

the first thickness is about 2000 Å to about 2500 Å; and the second thickness is about 3500 Å to about 4000 Å.

3. The method of claim 1, wherein the second thickness is at least about 1.2 times that of the first thickness.

4. The method of claim 3, wherein the second thickness is at least about 1.6 times that of the first thickness.

5. The method of claim 4, wherein the second thickness is at least about twice that of the first thickness.

6. The method of claim 1, comprising planarizing the first filled trench and the second filled trench by chemical-mechanical polishing.

7. The method of claim 1, comprising selectively enlarging the second trench isolation structure by: (1) selectively forming an oxidation barrier layer over the first trench isolation structure; and (2) growing the second trench isolation structure by thermal oxidation.

8. The method of claim 7, comprising forming the oxidation barrier layer at a thickness of about 100 Å.

9. The method of claim 8, wherein the oxidation barrier layer comprises nitride or oxynitride.

10. The method of claim 9, comprising depositing the oxidation barrier layer by a plasma-enhanced chemical vapor deposition (PECVD) technique.

11. The method of claim 10, comprising depositing the oxidation barrier layer at a power of about 250 W to about 350 W, at a temperature of about 400° C. or less, at a pressure of about 1 Torr or less, while feeding silane at a rate of about 50 sccm or less and ammonia at a rate of about 100 sccm or less.

12. The method of claim 10, comprising depositing the oxidation barrier layer while feeding nitrous oxide at a rate of about 50 sccm or less.

13. The method of claim 9, comprising wet etching to remove the deposited oxidation barrier layer.

14. The method of claim 13, comprising:

depositing the oxidation barrier layer, while feeding silane at a rate of about 50 sccm and ammonia at a rate of about 100 sccm; and wet etching the deposited oxidation barrier layer with a 10:1 aqueous hydrofluoric acid solution.

15. The method of claim 7, comprising:

depositing the oxidation barrier layer; and providing a mask on the deposited oxidation barrier layer, said mask containing a pattern having an opening over the second isolation structure; and etching the oxidation barrier layer at the opening in the mask.

16. The method of claim 15, wherein the mask comprises a photoresist mask.

17. The method of claim 1, comprising growing the second isolation region by thermal oxidation at a temperature of about 950° C. or less.

18. A method of manufacturing a semiconductor device having an active region isolated by a first insulated trench, said method comprising:

forming a first trench opening in a semiconductor substrate or in an epitaxial layer formed thereon;

forming a second trench opening in the semiconductor substrate or in the epitaxial layer formed thereon, concurrently with forming the first trench opening;

forming an oxide liner on an inside surface of the first trench opening by thermal oxidation;

filling the lined first trench opening with an insulating material;

filling the second trench opening with an insulating material to create a second insulated trench;

enlarging the first insulated trench to be deeper by thermal oxidation after said filling; and depositing an oxidation barrier layer over the second insulated trench before enlarging the first insulated trench by thermal oxidation.

19. The method of claim 18, comprising enlarging the first insulated trench by thermal oxidation at a temperature of about 950° C. or less.

20. The method of claim 18, comprising growing the first insulated trench from a thickness of about 2000 Å to about 2500 Å to a thickness of about 3500 Å to about 4000 Å.

21. The method of claim 18, comprising growing the first insulated trench to increase its thickness by a factor of at least about 1.2.

22. The method of claim 21, comprising growing the first insulated trench to increase its thickness by at least a factor of about 1.6.

23. The method of claim 22, comprising growing the first insulated trench to increase thickness by at least a factor of about two.

24. The method of claim 18, comprising depositing the oxidation barrier layer at a thickness of about 100 Å.

25. The method of claim 24, wherein the oxidation barrier layer comprises nitride or oxynitride.

26. The method of claim 25, comprising depositing the oxidation barrier layer by a plasma-enhanced chemical vapor deposition (PECVD) technique.

27. The method of claim 26, comprising depositing the oxidation barrier layer at a power of about 250 W to about 350 W, at a temperature of about 400° C. or less, at a pressure of about 1 Torr or less, while feeding silane at a rate of about 50 sccm or less and ammonia at about 100 sccm or less.

28. The method of claim 26, comprising depositing the oxidation barrier layer while feeding nitrous oxide at a rate of about 50 sccm or less.

29. The method of claim 25, comprising wet etching to remove the deposited oxidation barrier layer.

30. The method of claim 29, comprising:

depositing the oxidation barrier layer, while feeding silane at a rate of about 50 sccm and ammonia at a rate of about 100 sccm; and wet etching the deposited oxidation barrier layer with a 10:1 aqueous hydrofluoric acid solution.

31. The method of claim 18, comprising:

depositing the oxidation barrier layer; and providing a mask on the deposited oxidation barrier layer, said mask containing a pattern having an opening over the first isolation structure; and etching the oxidation barrier layer at the opening in the mask.

32. The method of claim 31, wherein the mask comprises a photoresist mask.

33. A method of manufacturing a semiconductor device having a first active region isolated by a first trench isolation structure and a second active region isolated by a second trench isolation structure, said method comprising:

concurrently forming the first trench isolation structure and the second isolation structure by: (1) etching a first trench and a second trench to about the same depth; and (2) filling the first trench and the second trench with an insulating material; and selectively enlarging the second trench isolation structure to a greater depth.

* * * * *